United States Patent
Liaw et al.

(10) Patent No.: US 7,522,444 B2
(45) Date of Patent: Apr. 21, 2009

(54) MEMORY CIRCUIT, METHOD FOR OPERATING A MEMORY CIRCUIT, MEMORY DEVICE AND METHOD FOR PRODUCING A MEMORY DEVICE

(75) Inventors: Corvin Liaw, Munich (DE); Heinz Hoenigschmid, Poecking (DE); Rainer Bruchhaus, Munich (DE)

(73) Assignee: Infineon Technologies AG, Munich (DE)

(*) Notice: Subject to any disclaimer, the term of this patent is extended or adjusted under 35 U.S.C. 154(b) by 72 days.

(21) Appl. No.: 11/374,413

(22) Filed: Mar. 13, 2006

(65) Prior Publication Data

US 2007/0211514 A1 Sep. 13, 2007

(51) Int. Cl.
*G11C 11/00* (2006.01)
(52) U.S. Cl. .................. 365/148; 365/100; 365/158
(58) Field of Classification Search ............ 365/100, 365/148, 158
See application file for complete search history.

(56) References Cited

U.S. PATENT DOCUMENTS

| | | | |
|---|---|---|---|
| 6,731,528 B2 * | 5/2004 | Hush et al. ............ 365/100 |
| 7,002,837 B2 * | 2/2006 | Morimoto ............. 365/148 |
| 7,215,568 B2 * | 5/2007 | Liaw et al. ............ 365/148 |
| 7,221,600 B2 * | 5/2007 | Hara et al. ......... 365/189.08 |
| 7,251,152 B2 * | 7/2007 | Roehr ................. 365/100 |
| 7,254,052 B2 * | 8/2007 | Liaw .................. 365/148 |
| 2005/0185444 A1 | 8/2005 | Yang et al. |
| 2005/0195673 A1 | 9/2005 | Asao et al. |
| 2007/0146012 A1 * | 6/2007 | Murphy et al. ........... 326/99 |

FOREIGN PATENT DOCUMENTS

KR 20040107435 12/2004

OTHER PUBLICATIONS

English Translation of KIPO Notification dated May 28, 2008 for counterpart application.

* cited by examiner

*Primary Examiner*—Richard Elms
*Assistant Examiner*—Hien N Nguyen
(74) *Attorney, Agent, or Firm*—Patterson & Sheridan, L.L.P.

(57) ABSTRACT

The present invention is related to a memory circuit comprising: a resistive memory element comprising a programmable metallization cell, a bit line, a selection transistor operable to address the resistive memory element for coupling the resistive memory element to the bit line, and a further transistor coupled with the resistive memory element for applying a predefined potential at a node between the selection transistor and the resistive memory element.

26 Claims, 6 Drawing Sheets

Schematic

○ to CBRAM Material
⬭ BL contact

Schematic

○ to CBRAM Material   ● contact to VPL
BL contact            Depletion implant

MEMORY CIRCUIT, METHOD FOR OPERATING A MEMORY CIRCUIT, MEMORY DEVICE AND METHOD FOR PRODUCING A MEMORY DEVICE

BACKGROUND OF THE INVENTION

1. Field of the Invention

The present invention relates to a memory circuit comprising a resistive memory element and a method for operating such a memory circuit. The present invention further relates to a memory device in which a resistive memory element is integrated and a method for producing such a device.

2. Description of the Related Art

Memory devices may comprise resistive memory elements for storing information. The resistive memory element can acquire different resistance states each of which may be associated with a logic state. Resistive memory elements are known as CBRAM memory elements (CBRAM: conductive bridging RAM), PMC memory elements (PMC: programmable metallization cell) or other terms may be used. A resistive memory element as understood in the present invention may include a solid state electrolyte which is sandwiched between an anode made from a migrating material and an inert cathode. By applying an electrical field on the solid state electrolyte the migrating material of the anode migrates into the solid state electrolyte rendering the resistive memory element conductive (low resistance) and by applying an inverse electrical field the migrating material is forced back to the anode rendering the resistive memory element non-conductive (high resistance).

Usually, such a kind of memory device has memory cells which include a selection transistor and the resistive memory element which are coupled in series between a plate element providing a fixed potential and a bit line. By activating the selection transistor (rendering the selection transistor conductive) the memory cell can be addressed and the resistive memory element can be accessed by applying a voltage between the bit line and the plate element. In a situation where the selection transistor is non-conductive and the resistive memory element is in a high resistance state, a node between the selection transistor and the resistive memory element is floating. Therefore, it is sensitive to induced disturbances which can be result of level transitions of a signal which is in a close proximity thereto such as an activation signal on a word line by which the respective selection transistor is controlled. Such disturbances may result in an undesired voltage drop over the resistive memory element which can reduce the resistance of the resistive memory element. A change of the resistance of the resistive memory element may result in that the logic state to which the resistance state is associated cannot be detected correctly. Even if the voltage drop over the resistive memory element is not sufficient to program the resistive memory element to a low resistance state, repeated appliance of the voltage drops over the resistive memory element can cause a change in the resistance so that after a plurality of accesses of the respective memory cell the stored information cannot be detected correctly. Consequently, the data retention time depends on the number of access cycles. Even if the stored information can be detected correctly after a change of the resistance of the resistive memory element such a reduction of the resistance may further result in a prolongation of the access time on the memory cell.

SUMMARY OF THE INVENTION

One embodiment of the present invention a memory device including resistive memory cells is provided to avoid a degradation of the resistance state to which a resistive memory element is set due to disturbances induced from neighbored signal lines can be avoided.

A further embodiment of the present invention provides a method for operating such a memory device. Furthermore, another embodiment of the present invention provides a memory device which provides protection against signal disturbances at the node between the selection transistor and the resistive memory element which can easily be produced, and a method for producing such a memory device.

One or more of these embodiments of the memory circuit, the method for operating such a memory circuit, a memory device and a method for producing such a memory device are provided according to the independent claims. Preferred embodiments of the present invention are indicated in the dependent claims.

According to a first aspect a memory circuit is provided which comprises a resistive memory element including a programmable metallization cell, a bit line, a selection transistor to address the resistive memory element coupling the resistive memory element to the bit line and a further transistor coupled to the resistive memory element applying a predefined potential at a node between the selection transistor and the resistive memory element. Thereby, it can be achieved that the node between the selection transistor and the resistive memory element is hold on the predefined potential at least at the time when the selection transistor is non-conductive so that no floating of the node can occur which may result in a change of the resistance state of the resistive memory element.

According to a further aspect a memory circuit is provided which comprises a first and a second resistive memory element each, a first and a second bit line, a first selection transistor coupled to the first resistive memory element and to address the first resistive memory element for coupling the first resistive memory element with the first bit line, a second selection transistor coupled with the second resistive memory element and to address the second resistive memory element coupling the second resistive memory element with the second bit line, a first further transistor coupled with the first resistive memory element for applying a predefined potential at a first node between the first selection transistor and the first resistive memory element and a second further transistor coupled with the second resistive memory element to apply a predefined potential at a second node between the second selection transistor and the second resistive memory element.

According to a further aspect a method for operating a memory circuit is provided wherein the memory circuit comprises a resistive memory element, a bit line, a selection transistor to address the resistive memory element coupling the resistive memory element to the bit line and a further transistor coupled with the resistive memory element to apply a predefined potential wherein the selection transistor becomes conductive if a first potential is applied and becomes non-conductive if a second potential is applied wherein the further transistor becomes conductive if the second potential is applied and becomes non-conductive if a third potential is applied wherein the third potential is selected such that the selection transistor is non-conductive wherein the selection transistor is controlled via a first word line and the further transistor is controlled via a second word line. The method for operating includes the steps of applying the second potential on the first and second word lines in an idle state of the memory circuit so that the selection transistor is non-conductive and the further transistor is conductive to apply the predefined potential on the resistive memory element; and, for addressing the resistive memory element, applying the first potential on the first word line to render the selection transistor conductive to apply a bit line potential to the resistive memory element and applying the third potential on the second word line to render the further transistor non-conductive. The method of the present invention allows to operate a memory such that a node between the resistive memory element and the selection transistor is set on a predefined potential at any time.

According to a further aspect a memory device is provided which comprises a semiconductor substrate including a first memory cell comprising a selection transistor structure and a further transistor structure, a signaling layer arranged on the semiconductor substrate and including a first bit line and a first and a second word line, a memory layer arranged on the signaling layer and comprising a solid state electrolyte and a plate structure arranged on the memory layer.

According to a further aspect a method for producing a memory device is provided which comprises the steps of providing a semiconductor substrate including a first memory cell comprising a selection transistor structure and a further transistor structure, of providing a signaling layer on the semiconductor substrate wherein the signaling layer includes a first bit line and a first and a second word line; of providing a memory layer on the signaling layer comprising a solid state electrolyte; and of providing a plate structure on the memory layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
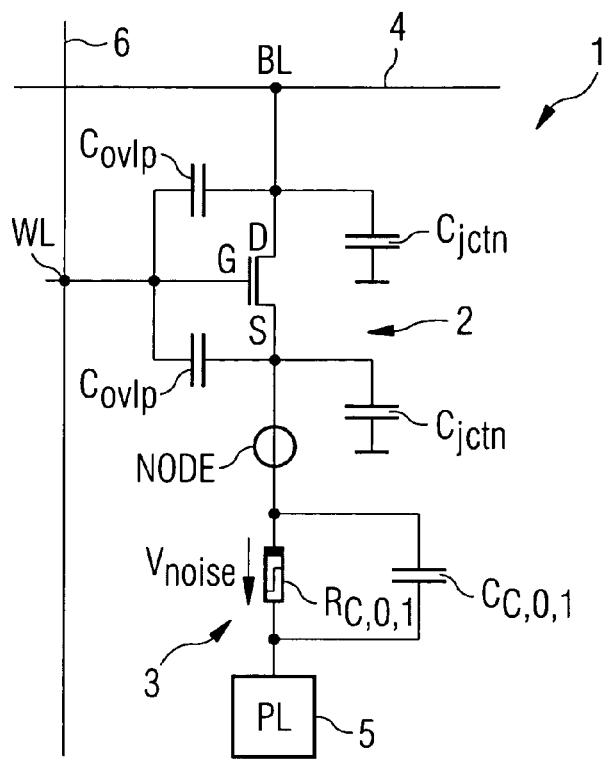
FIG. 1 illustrates a schematic diagram of a resistive memory cell as used in a memory circuit, according to one embodiment of the invention.

In FIG. 1 a schematic diagram of a resistive memory cell 1 as used in a memory device is shown. The resistive memory cell 1 comprises a selection transistor 2 and a resistive memory element 3 which are coupled in series between a bit line 4 and a plate element 5. The plate element 5 supplies a predetermined plate potential which is set to a fixed potential value. In detail, a first terminal of the selection transistor 2 is coupled to the bit line 4 and a second terminal of the selection transistor 2 is coupled with a first terminal of the resistive memory element 3. A second terminal of the resistive memory element 3 is coupled to the plate element 5. A gate terminal of the selection transistor 2 is coupled to a word line 6 on which an activation signal can be applied to render the selection transistor 2 conductive or non-conductive.

The resistive memory element 3 is configured as a CBRAM memory element which has a solid state electrolyte material which is sandwiched between an anode and a cathode. The anode includes a material which is able to migrate into or to be removed from the solid state electrolyte material depending on a direction and strength of an electrical field which is applied by the electrodes. The cathode is made of an inert material.

The resistive memory element 3 can be set to different resistance states, e.g. in a low resistance state having a low resistance and a high resistance state having a high resistance. In a high resistance state the resistive memory element 3 has a resistance in a range between 1 to 10 MegΩ such that the node (NODE) is coupled to the plate element by this resistance. In a case where the resistive memory element 3 is in the high resistance state and the selection transistor 2 is rendered non-conductive, the node (NODE) between the selection transistor 3 and the resistive memory element 3 is substantially floating so that disturbances can be induced thereon.

The disturbances on the node (NODE) can result in that voltage drop over the resistive memory element 3 occurs which may lead to a drop of the resistance of the resistance state such that a logic state associated to the resistance state is changed and the stored information is modified in an undesired manner.

Figure 2:
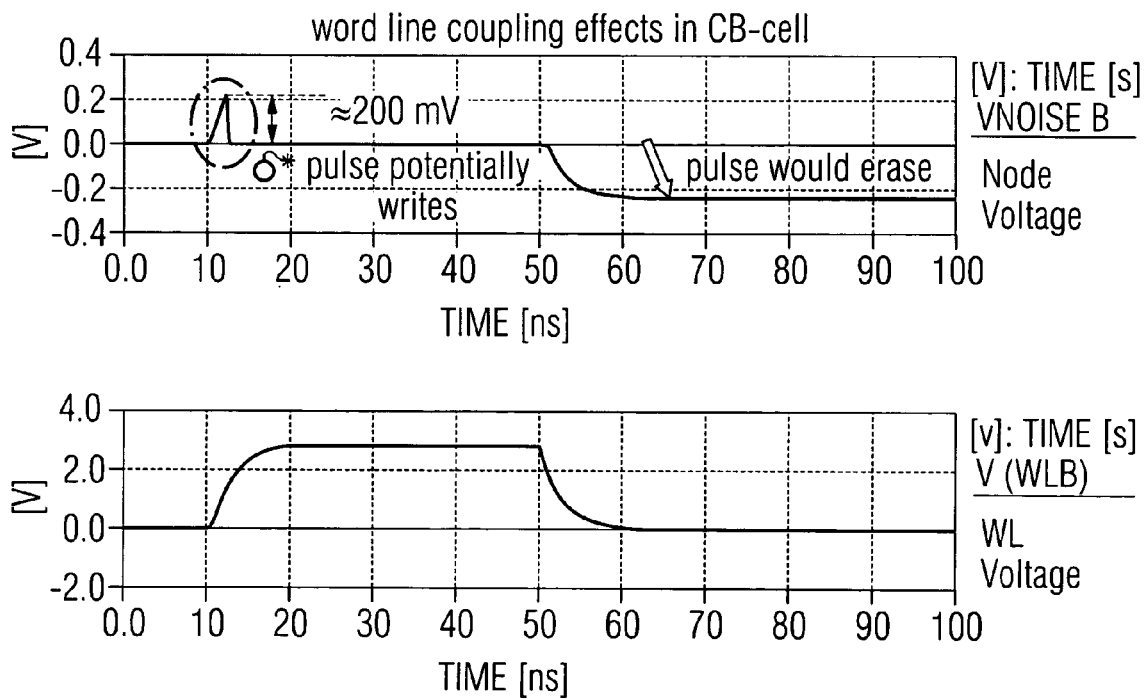
FIG. 2 is a timing diagram illustrating an induction of disturbances at a node between the selection transistor and the resistive memory element of the resistive memory cell.

As shown in the signal time diagram of FIG. 2 a level transition of the activation signal on the word line (WL voltage) can induce such a disturbance at the node (NODE) (Node voltage). If the activation signal renders the selection transistor 2, the node is non-floating such that a disturbance induced by the level transition of the word line has no substantial effect on the voltage drop over the resistive memory element 3. If the level transition of the activation signal renders the selection transistor 2 non-conductive the node (NODE) is now floating so that the level transition of the activation signal can be induced on node (NODE) resulting in a voltage drop over the resistive memory element 3. Depending on the direction of the voltage drop, the voltage drop can lead to a drop of the resistance thereby changing the logic state which is associated thereto so that the information which is stored in the memory cell may be changed in an undesired manner. Even if the voltage drop does not lead to a significant resistance change the inducing of a disturbance potential in a repeated manner may lead to a degradation of the information stored in the memory cell (i.e. in a resistance drop which renders it more difficult to detect the information stored in the respective memory cell).

Figure 3A:
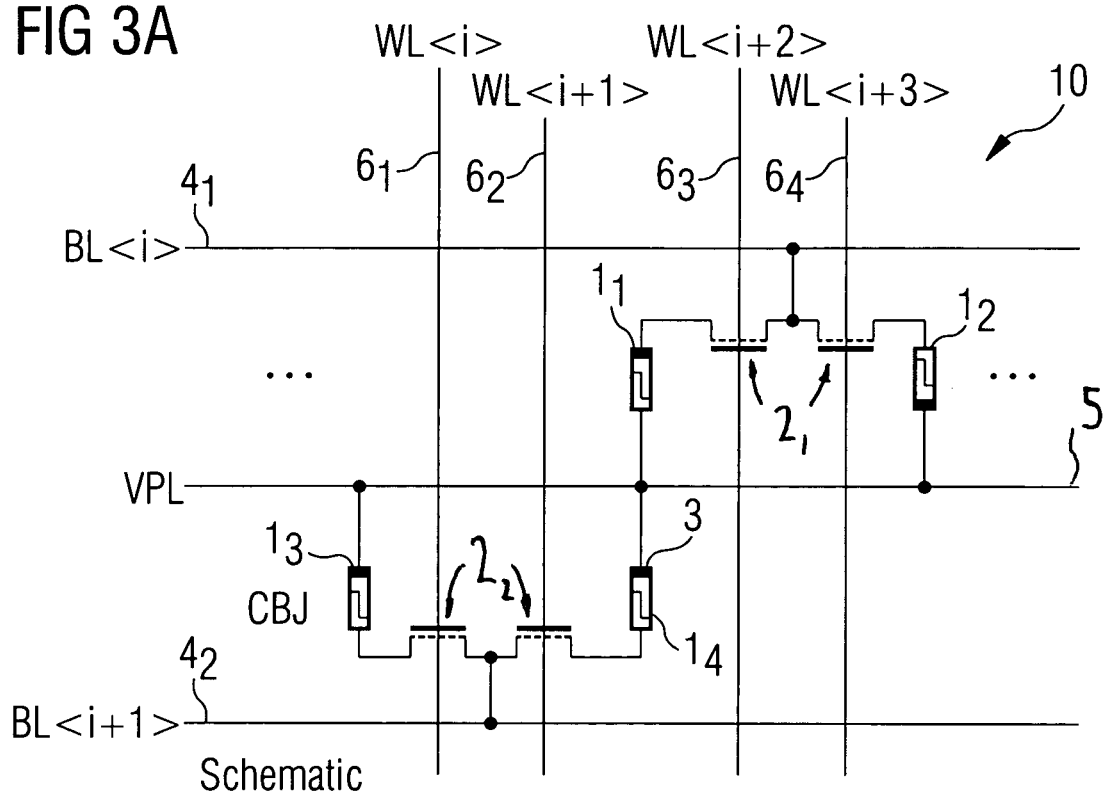
FIG. 3A illustrates a conventional memory circuit having a number of memory cells.

In the FIG. 3A a memory cell array 10 is depicted including a number of word lines $6_1$ to $6_4$ and a number of bit lines $4_1$ and $4_2$ on which resistive memory cells can be arranged. In the shown example two resistive memory cells $1_1$ and $1_2$ are coupled with the first bit line $4_1$ and two resistive memory cells $1_3$ and $1_4$ are coupled with the second bit line $4_2$. In detail the two resistive memory cells $1_1$ and $1_2$ on the first bit line $4_1$ are arranged so that the first terminals of the respective selection transistors 2 are commonly coupled to the first bit line 4 and their gate terminals are coupled with neighboring word lines. The gate terminals are coupled with the third word line $6_3$ and with the fourth word line $6_4$. The second terminals of the resistive memory elements of the first and second resistive memory cells $1_1$ and $1_2$ are coupled with the plate element 5 on different locations.

On the second bit line $4_2$ a third and a fourth resistive memory cell $1_3$ and $1_4$ are arranged. The first terminals of the respective selection transistors 2 are commonly coupled with the second bit line $4_2$ wherein the second terminals of the respective resistive memory elements $1_3$ and $1_4$ are coupled with the plate element 5 at different locations. The second terminal of the resistive memory element of the first resistive memory cell $1_3$ and the second terminal of the resistive memory element 3 of the fourth resistive memory cell $1_4$ are coupled with the plate element 5 at the same location.

Figure 3B:
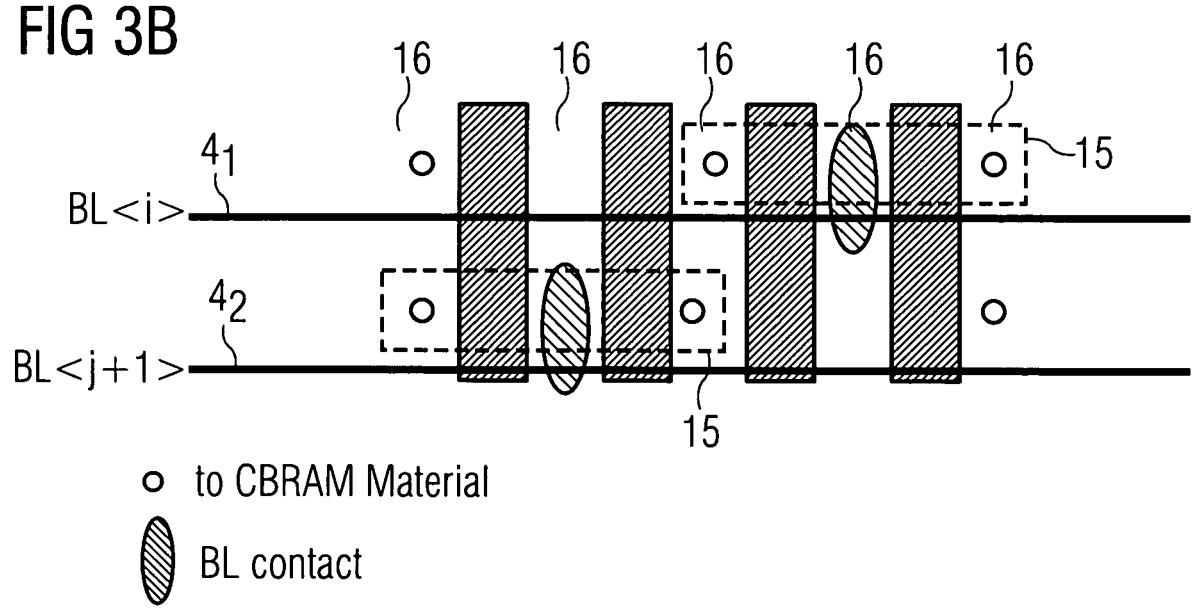
FIG. 3B illustrates a layout of an integrated realization of the schematic diagram of FIG. 3A.

In FIG. 3B, a schematic top view of a layout of the memory device according to FIG. 3A is shown. It can be seen that a pair of two resistive memory cells, the first terminals of the selection transistors of which are commonly coupled to the respective bit line, are arranged staggered on two different bit lines so that a kind of checkerboard pattern regarding the arrangement of the pairs of the resistive memory cell $1_1$ and $1_2$, and $1_3$ and $1_4$, respectively is achieved. In detail, the top view of the layout schematic shows the bit lines $4_1$ and $4_2$ which extend over active areas 15 which represent the source/drain regions and the channel area of the respective selection transistors 2. The active areas 15 over which the bit line extend are physically isolated from the non-active areas and from the active areas over which a neighbored bit line extends by means of a shallow trench isolation (STI). Along one of the bit lines in every second source/drain region a plug is provided which connects the respective source/drain region with a layer including the resistive memory element. In the respective source/drain region arranged in between them the bit line is connected with the source/drain region. In the given example along the bit line every fourth source/drain region is connected with the bit line.

Thereby, it remains one source/drain region which is used neither for a connecting with a respective resistive memory element nor for a connecting with the bit line. The second bit line has a same configuration while the source/drain region which is connected with the respective bit line is neighbored to the source/drain region over which the neighbored bit line extends is unused. Thus, a staggered design of memory cells in the memory cell array can be provided.

To overcome the issue regarding the disturbances which can be induced in the node (NODE) when the selection transistor is rendered non-conductive and the resistive memory element 3 is at a high resistance state, a further transistor is coupled with the node (NODE). The further transistor which couples the node (NODE) with a predefined potential at least at the time at which the selection transistor is non-conductive and the resistive memory element is at a high resistance state. It can be provided that the further transistor couples the predetermined potential at the node (NODE) at the same time the selection transistor is non-conductive. It is furthermore preferred to couple the node (NODE) with the predefined potential by means of the further transistor and to decouple the node (NODE) from the predefined potential after the selection transistor has been rendered conductive. Thereby, it can be achieved that the node (NODE) is always connected to a fixed potential. To avoid the provision of a further predetermined potential the predetermined potential can be selected as the plate potential provided by the plate element 5.

Figure 4:
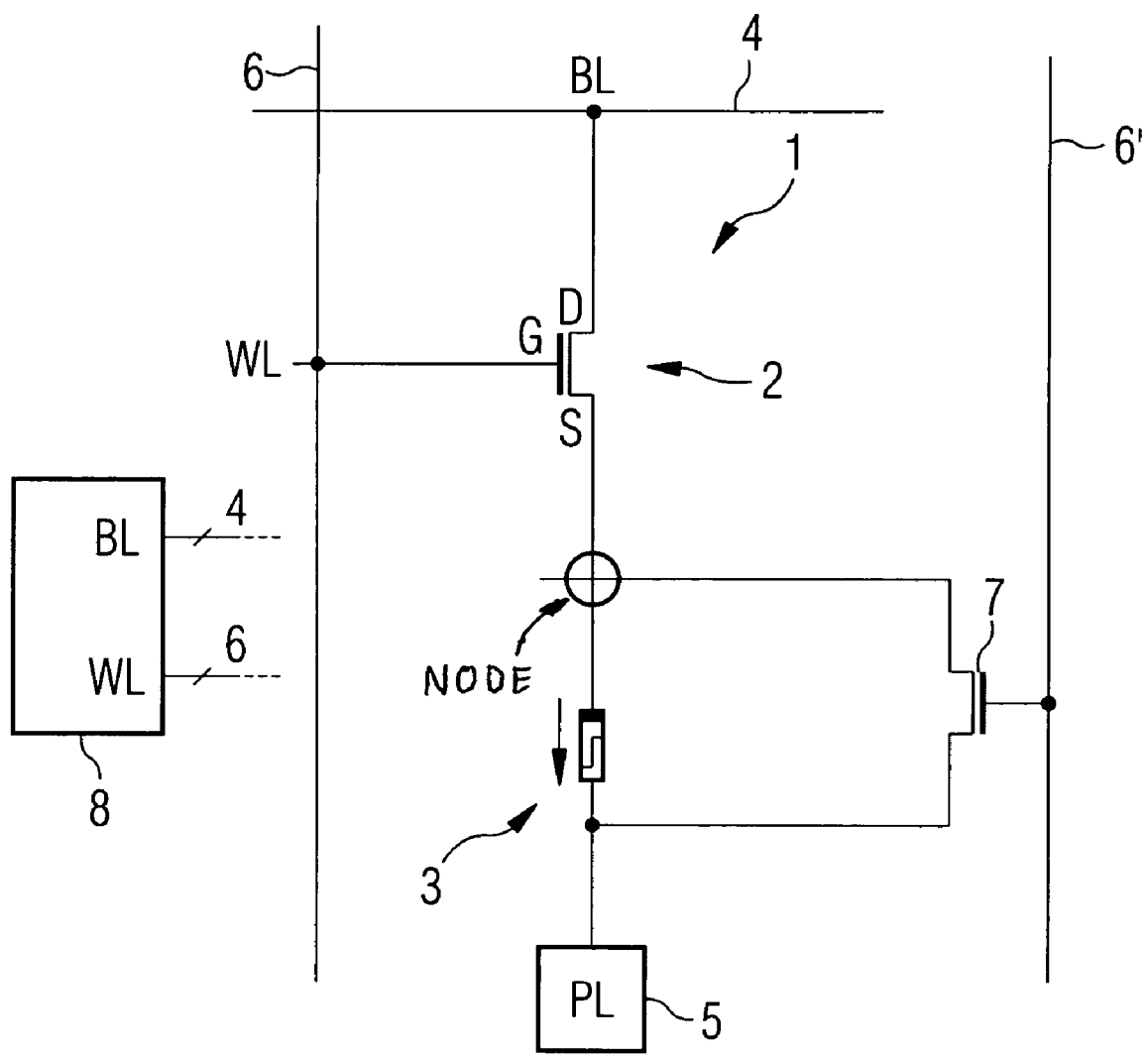
FIG. 4 illustrates a schematic diagram of a memory cell according to an embodiment of the invention.

In detail, as shown in FIG. 4 the further transistor 7 is provided which is coupled in parallel to the resistive memory element 3 such that it couples the node (NODE) with the plate element 5 if the further transistor 7 is rendered conductive and which decouples the node (NODE) from the plate element 5 if the further transistor 7 is rendered non-conductive. In detail, a first terminal of the further transistor 7 is coupled with the node (NODE) and the second terminal of the further transistor 7 is coupled with the plate element 5. A gate terminal of the further transistor 7 is coupled with a neighbored second word line 6' the signaling of which is selected so that the further transistor 7 can be independently controlled without activating and/or deactivating the selection transistors 2 of further memory cells arranged on the neighbored bit line. This can be achieved in that the further transistors 7 are designed as field effect transistors of a depletion type while the selection transistors 2 which are coupled to the first word line 6 are designed as field effect transistors of an enhancement type or vice versa.

In the given example, to control the selection transistor 2 the activation signal can have a signal level of a first potential, e.g. a ground potential, and a second signal level on a second potential, e.g. a high level wherein the selection transistor 2 is rendered non-conductive if the first potential is applied and rendered conductive if the second potential is applied. As the further transistor 7 is of a depletion type the appliance of a first potential on the neighbored word line 6' results in that the further transistor 7 is rendered conductive and the further selection transistors arranged on the neighbored word line are still non-conductive. Thereby, in an idle state the node (NODE) of the non-addressed memory cell 1 is coupled with the plate potential of the plate element 5 via the further transistor 7. If the respective memory cell 1 are to be addressed, the activation signal of the word line 6 has a transfer from the first potential to the second potential so that the selection transistor 2 is made conductive. To render the further transistor 7 non-conductive without rendering conductive the further selection transistors of the further memory cells arranged on the neighbored word line 6' a third potential is applied to the neighbored word line 6' which is configured to render the further transistor 7 non-conductive without rendering the selection transistor of the further memory cells on the neighbored word line 6' conductive. The third potential, therefore, preferably has a sign which is different to the sign of the second potential with regard to the first potential. In other words, the first potential is selected in the range between the second potential and the third potential. Commonly spoken, the selection transistor 2 and the further transistor 7 are designed so that if arranged on the same word line selection transistors 2 and further transistors 7 can be set in a state wherein both are non-conductive and set in states wherein only one of the selection transistor 2 or the further transistor 7 are rendered conductive while the other is rendered non-conductive.

Generally, the selection transistor may become conductive if the first potential is applied and may become non-conductive if a second potential is applied, wherein the further transistor may become conductive if the second potential is applied and may become non-conductive if a third potential is applied.

Furthermore, the selection transistor is controlled via a first word line and the further transistor is controlled via a second word line. The third potential may be selected so that the selection transistor is non-conductive. This allows for the second word line to be used to control a further selection transistor of a further resistive memory cell arranged thereon. It can further be provided that the selection transistor is a field effect transistor of an enhancement type and the further transistor is a field effect transistor of a depletion type, wherein the first potential is set in the range between the second and the third potential. Thereby, it can be achieved that the further transistor and the selection transistor can be independently controlled even if arranged on the same word line by means of the first, second and third potential.

Moreover, a control circuit may be provided to apply the first, second and third potentials on the first and second word lines and to apply at least one of a writing and reading potential on the bit line.

The control circuit may further apply the second potential on the first and second word lines in an idle state of the memory circuit so that the selection transistor is non-conductive and the further transistor is conductive to apply the predetermined potential on the resistive memory element.

Furthermore, the control circuit may apply the first potential on the first word line to render the selection transistor conductive to apply a bit line potential to the resistive memory element when the resistive memory element should be addressed, and to apply a third potential on the second word line to render the further transistor non-conductive. The third potential may be applied before the bit line potential is applied at the bit line to avoid a shortcut between the bit line and the plate element.

In particular, the control circuit may apply the third potential on the second word line either at the same time or after the first potential has been applied to the first word line.

A first terminal of the resistive memory element may be coupled with a first terminal of the selection transistor and a plate element is coupled with a second terminal of the resistive memory element to apply a plate potential, wherein a second terminal of the selection transistor is coupled with the bit line wherein the further transistor has a first terminal which is coupled with the first terminal of the resistive memory element in the second terminal on which predefined potential is applied.

The second terminal of the further transistor may be connected to the plate element so that the plate potential is applied on the resistive memory element as the predefined potential.

Moreover, a gate terminal of the further transistor may be connected to the second word line and the gate terminal of the selection transistor may be connected to the first word line.

A control circuit is provided which is coupled to the word line and bit line to apply the respective signals and potentials.

Figure 5A:
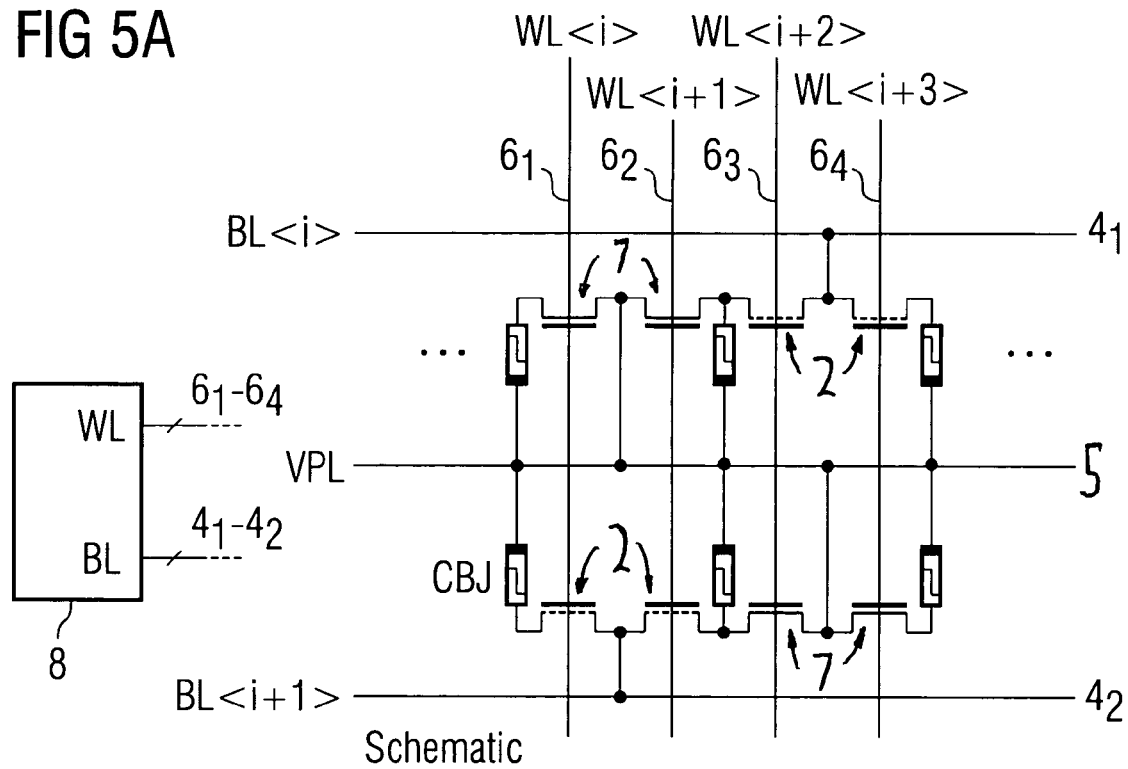
FIG. 5A illustrates a memory circuit having a memory cell according to a further embodiment of the invention.

In FIG. 5A one embodiment of the present invention is depicted. In contrast to the memory device of FIG. 3A, at the crossing points of word lines $6_1$-$6_4$ and bit lines $4_1$-$4_2$ which were non occupied by memory cells with regard to the embodiment of FIG. 3A, further transistors 7 are now arranged which are controlled by the respective word line $6_1$-$6_4$ while the second terminals of the respective further transistors 7 are connected with the plate element 5. Thereby, resistive memory cells can be provided each having a pair of a selection transistor 2 and a further transistor 7 arranged side by side. The memory cells are arranged alternatingly in such a way that along a bit line a first memory cell having a respective left word line $6_2$, whereon a further transistor 7 is arranged, and a respective right word line $6_3$, on which a respective selection transistor 2 is arranged.

Further along the bit line following the first memory cell a second memory cell is arranged having a selection transistor arranged on a respective left word line 2 and a further transistor 7 arranged on a respective right word line. Thereby, alternating pairs of two further transistors 7 and pairs of two selection transistors 2 are arranged on each two neighboring word lines $6_1$-$6_4$ along one of the bit line $4_1$ or $4_2$. With regard to two neighboring bit lines $4_1$-$4_2$ at a respective one of the word lines $6_1$-$6_4$ a further transistor 7 and a selection transistor 2 are alternatingly arranged along the word line.

Generally, the control circuit 8 is provided to apply the first, second, and third potentials on the first and second word lines and to apply at least one of a writing and reading potentials on the bit line 4. The control circuit 8 may be operable to apply the second potential on the first and second word line in an idle state of the memory circuit so that the selection transistors are non-conductive and the further transistors are conductive to apply the predefined potential on the resistive memory elements. For addressing the first resistive memory element the control circuit is operable to apply the first potential on the first word line 6 to render the selection transistor conductive to apply a bit line potential to the resistive memory element and to apply the third potential on the second word line 6' to render the further transistor 7 non-conductive. The applied third potential on the second word line 6' ensures that the second selection transistor 2 connected with the second word line remains non-conductive such that the second resistive memory element 3 is not accessed thereby.

For addressing a second of the resistive memory elements the control circuit 8 may be operable to apply the first potential on the second word line 6' to render the second selection transistor conductive, to apply a bit line potential to the second resistive memory element and to apply the third potential on the first word line to render the second further transistor non-conductive. The bit line potential is applied to the bit line 4 after the second further transistor 7 is rendered non-conductive to avoid a shortcut between the bit line and the plate element over the second further transistor.

In particular, the control circuit may be operable to apply the third potential on the second word line either at the same time or after the first potential has been applied to the first word line. The control circuit may be further operable to apply the third potential on the first word line either at the same time or after the first potential has been applied to the second word line when accessing the second resistive memory element.

According to a further embodiment a first terminal of the first resistive memory element is coupled with a first terminal of the first selection transistor and a plate element is coupled with a second terminal of the first resistive memory element to apply a plate potential wherein a second terminal of the first selection transistor is coupled with the bit line wherein the first further transistor has a first terminal which is coupled with a first terminal of the first resistive memory element and a second terminal on which a predefined potential is applied, wherein a first terminal of the second resistive memory element is coupled with a first terminal of the second selection transistor and the plate element is coupled with a second terminal of the second resistive memory element to apply the plate potential, wherein second terminal of the second selection transistor is coupled with the first terminal of the second resistive memory element and a second terminal on which a predefined potential is applied.

Furthermore, the second terminals of the first and second further transistors may be connected to the plate element 5.

Moreover a gate terminal of the first further transistor may be connected to the second word line and the gate terminal of the first selection transistor is connected to the first word line and wherein a gate terminal of the second further transistor is connected to the first word line and a gate terminal of the second selection transistor is connected to the second word line.

Figure 5B:
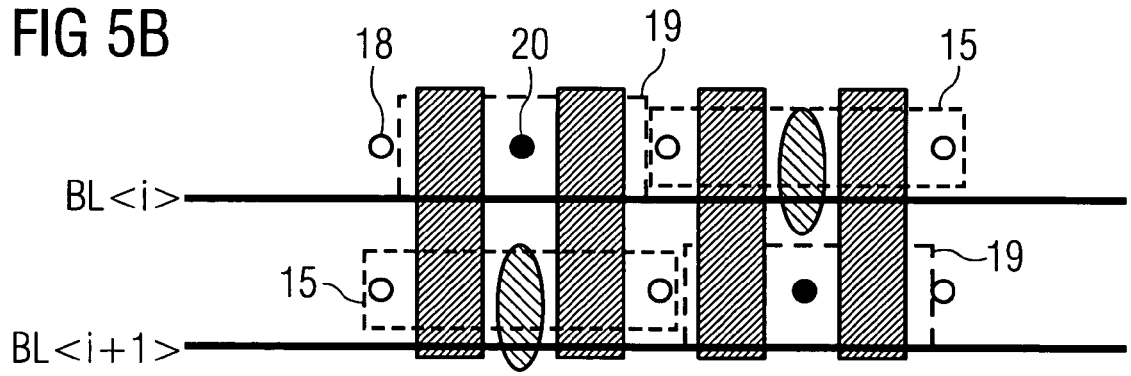
FIG. 5B illustrates a layout view on the top of a substrate in which the memory circuit of FIG. 5A is implemented, according to one embodiment of the invention.

As shown in FIG. 5B and in contrast to the FIG. 3B the source/drain region which has been a non-active area and therefore unused in the embodiment of FIG. 3B is now provided with an interconnection element 20 which connects the respective source/drain region 16 with the plate element 5. Furthermore, another interconnect element 18 to the resistive memory element may be provided. another active area 19 is provided. To provide the further transistors 7 as field effect transistors of a depletion type in the other active area 19 a depletion implant (indicated by the dotted line) is provided. Therein, the further transistors 7 should be provided so that the further transistors 7 are made of a depletion type. The depletion implant may be processed by an implant process, diffusion process and the like.

Figure 6A:
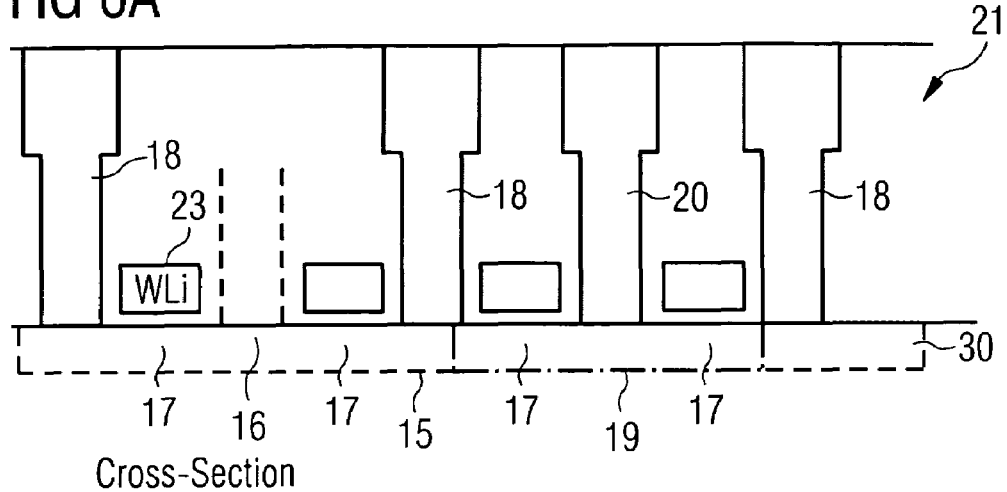
FIGS. 6A to 6E illustrate a method for producing a memory device according to one embodiment of the present invention.

With regard to the FIGS. 6A to 6E process stages for illustrating the production process for a memory device according to an embodiment of the present invention is shown. As shown in FIG. 6A a semiconductor substrate 30 is provided in which source/drain regions 16 and channel regions 17 of two selection transistors are arranged in the active area 15 and the other active area 19 are provided with a depletion implant in which two further transistors are arranged. Along the bit line the active areas 15 and other active areas 19 are arranged in an alternating manner. In FIGS. 6A-6E the bit line extends in parallel to the paper plane wherein the word lines 23 which are arranged extending over the respective channel regions 17 substantially perpendicular to the bit line. Every second source/drain region 16 the portion of which is in the active area 15 is provided with an interconnection element 18 to provide a contacting through an insulating signaling layer 21 to a solid state electrolyte material which later forms the resistive memory element. The signaling layer 21 contains the word line and bit line structures. Between two of the interconnection elements 18 in the respective source/drain region which lies in the other active area 19 a further interconnection element 20 is provided which is preferably produced with the same one or more process steps with which the interconnection element 18 is implemented. The interconnection elements 18, 20 are formed by lithographic processes in the signaling layer 21 provided as an insulating material, e.g. silicon dioxide and the like so that the interconnection elements 18, 20 are freely contactable on the surface of the signaling layer 21.

Figure 6B:
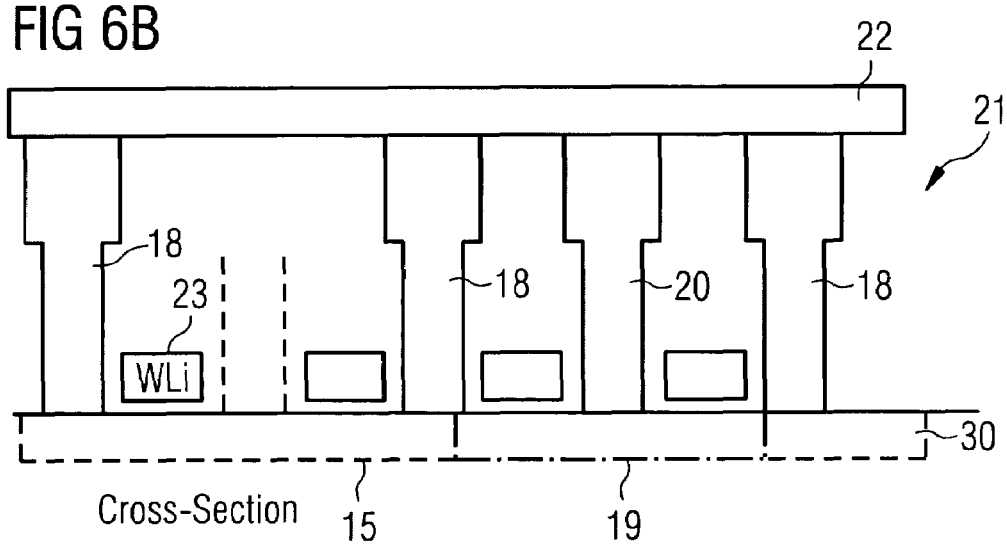

As shown in FIG. 6B, on the surface of the signaling layer 21 a solid state electrolyte material 22 is applied, e.g. deposited, so that each of the interconnection elements 18 and the further interconnection elements 20 are in contact therewith.

Figure 6C:
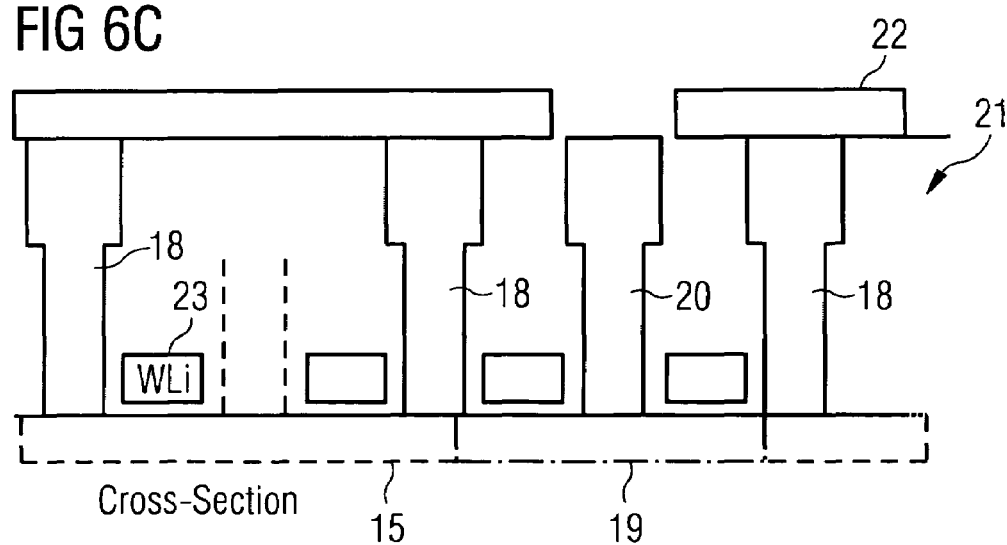
Figure 6D:
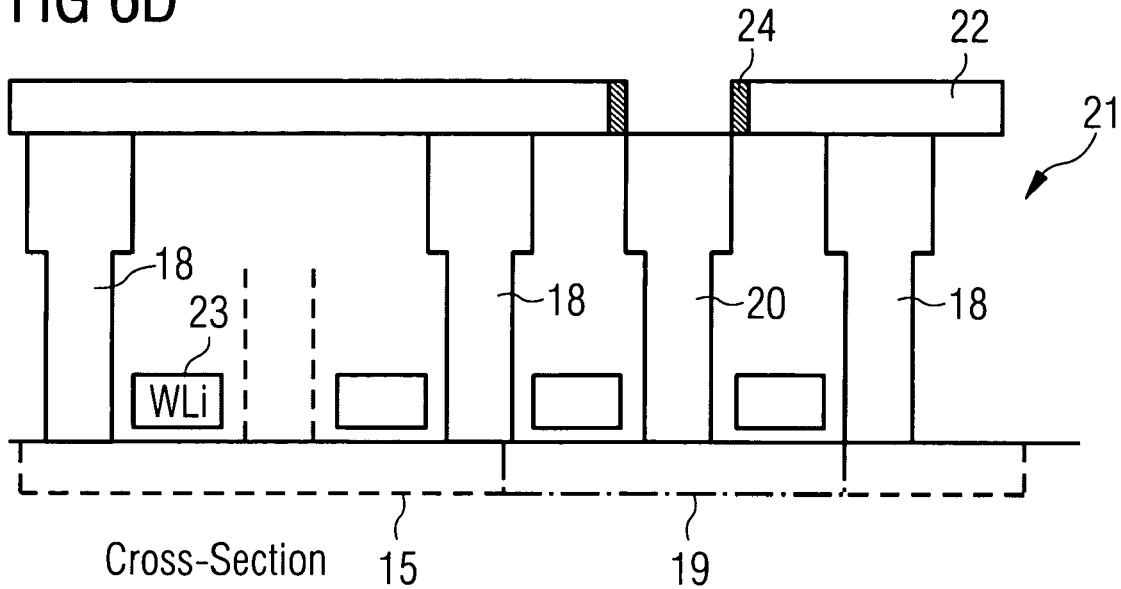
Figure 6E:
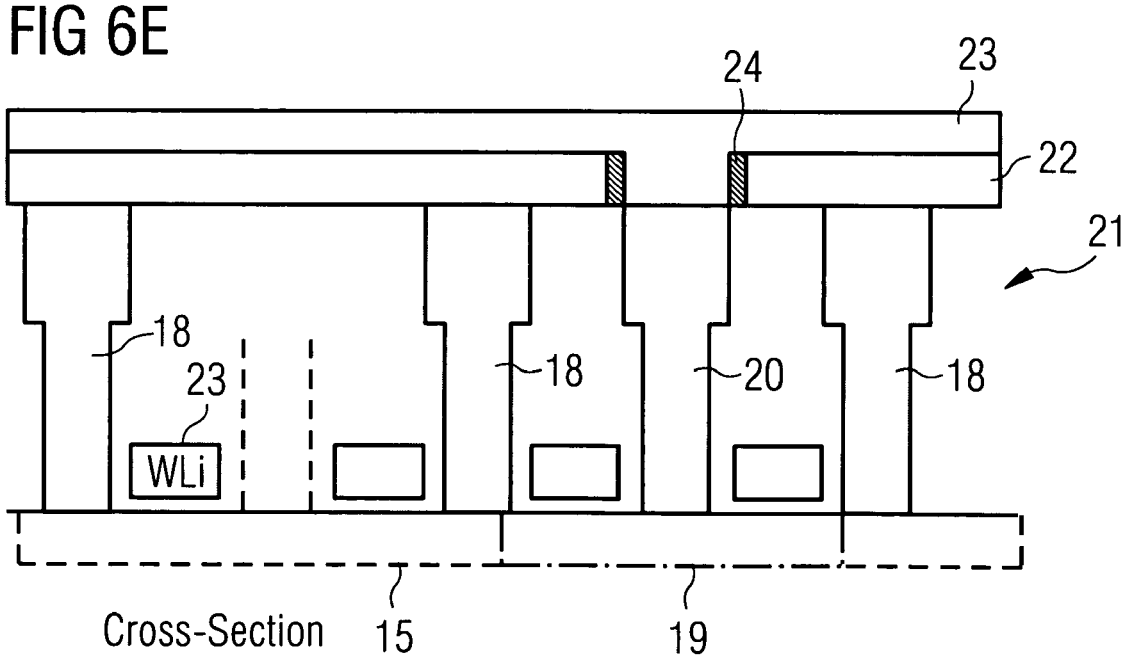

As shown in the process state of FIG. 6C the solid state electrolyte material 22 which covers the upper surface of the further interconnection element 20 is removed and, as shown in FIG. 6D, insulating spacers 24 are applied such that the further interconnection element 20 is separated and insulated from the solid state electrolyte material 22.

Thereafter, a conductive plate element material 23 is applied to cover the cell array so that one electrode of the resistive memory element 3 formed by the solid state electrolyte material as well as one end of the further interconnection element 20 which is revealed from the solid state electrolyte material are simultaneously connected with the plate element.

Thereby, a memory cell is provided which is located partially on the active area 15 and on the other active area 19 along a bit line.

Compared to conventional memory devices of this kind the area in which the depletion implant is provided usually remains unused no further chip area is needed to implement the further transistors 7 for each of the resistive memory cell.

Generally, the selection transistor and the further transistor may each have a first source/drain region wherein an interconnection element is provided in the signaling layer which provides an electrical contact between the first source/drain region and the memory layer.

Furthermore, the further transistor may include a second source/drain region wherein a further interconnection element is provided which interconnects the second source/drain region and the plate structure.

The first word line may be coupled with the gate region of the selection transistor structure and the second word line may be coupled with the gate region of the further transistor structure.

The first selection transistor may include a third source/drain region which is coupled with the bit line wherein the second memory cell is provided wherein a third source/drain region of a second selection transistor is provided as a common third source/drain region together with a third source/drain region of the first further transistor.

Alternatively or additionally, a second memory cell may be provided wherein a second source/drain region of a second further transistor is provided as common second source/drain region together with the second source/drain region of the first further transistor.

In particular, the selection transistor structure is formed as a field effect transistor of an enhancement type and the further transistor structure is formed as a field effect transistor of a depletion type wherein the first and second further transistor structures are both formed in a dopant well within the semiconductor substrate, wherein the dopant well has a different dopant concentration compared to the semiconductor substrate.

The first and the second memory cell may be arranged along at the first bit line wherein a second bit line is provided which extends substantially in parallel to the first bit line wherein along the second bit line a third and a fourth memory cells are arranged wherein in a direction substantially perpendicular to the extension of the bit lines the selection transistor structures and the further transistor structures are arranged alternatingly.

Generally, the providing of the interconnection element and the further interconnection element may be performed in one or more same process steps wherein after providing the memory layer in at least the region located above the further interconnection element the memory layer is removed and thereafter the plate structure is applied such that the further interconnection element comes in electrical contact with the plate structure.

After removing the memory layer above the further interconnection element a sidewall of the memory layer may be provided with an insulating layer before the plate structure is applied.

Furthermore, the first selection transistor structure may be provided with a third source/drain region which is coupled with the bit line wherein a second memory cell may be provided wherein a third source/drain region of the third selection transistor structure may be provided as a common third source/drain region together with the third source/drain region of the first further transistor structure.

A second memory cell may be provided wherein a second source/drain region of a second further transistor may be provided as a common second source/drain region together with the second source/drain region of the first further transistor structure.

While the foregoing is directed to embodiments of the present invention, other and further embodiments of the invention may be devised without departing from the basic scope thereof, and the scope thereof is determined by the claims that follow.

What is claimed is:

1. A memory circuit, comprising:
   a resistive memory element,
   a bit line;
   a selection transistor to address the resistive memory element by coupling the resistive memory element to the bit line; and
   a further transistor coupled to the resistive memory element to apply a predefined potential at a node between the selection transistor and the resistive memory element.

2. The memory circuit of claim 1, wherein the resistive memory element further comprises a programmable metallization cell.

3. The memory circuit of claim 1,
   wherein the selection transistor becomes conductive if a first potential is applied, and becomes non-conductive if a second potential is applied; and
   wherein the further transistor becomes conductive if the second potential is applied, and becomes non-conductive if a third potential is applied.

4. The memory circuit of claim 3, wherein the selection transistor is controlled via a first word line and the further transistor is controlled via a second word line.

5. The memory circuit of claim 4, wherein the third potential is selected such that the selection transistor is non-conductive.

6. The memory circuit of claim 5, wherein the selection transistor is of an enhancement type and the further transistor of a depletion type, wherein the first potential is set in a range between the second and the third potential.

7. The memory circuit of claim 6, wherein a control circuit is provided to apply the first, second and third potentials on the first and second word lines and to apply at least one of a writing and reading potentials on the bit line.

8. The memory circuit of claim 7, wherein the control circuit:
   applies the second potential on the first and second word line in an idle state of the memory circuit so that the selection transistor is non-conductive and the further transistor is conductive to apply the predefined potential on the resistive memory element; and
   for addressing the resistive memory element, applies the first potential on the first word line to render the selection transistor conductive to apply a bit line potential to the resistive memory element; and to apply the third potential on the second word line to render the further transistor non-conductive.

9. The memory circuit of claim 8, wherein the control circuit applies the third potential on the second word line either at the same time or after the first potential has been applied to the first word line.

10. The memory circuit of claim 1, wherein:
    a first terminal of the resistive memory element is coupled to a first terminal of the selection transistor and a plate element is coupled to a second terminal of the resistive memory element to apply a plate potential;
    a second terminal of the selection transistor is coupled with the bit line; and
    the further transistor has a first terminal which is coupled with the first terminal of the resistive memory element and a second terminal on which a predefined potential is applied.

11. The memory circuit of claim 10, wherein the second terminal of the further transistor is connected to the plate element.

12. The memory circuit of claim 11, wherein a gate terminal of the further transistor is connected to the second word line and a gate terminal of the selection transistor is connected to the first word line.

13. A memory circuit, comprising:
    a first and a second resistive memory element;
    a first and a second bit line;
    a first selection transistor coupled with the first resistive memory element and to address the first resistive memory element coupling the first resistive memory element with the first bit line;
    a second selection transistor coupled to the second resistive memory element and to address the second resistive memory element coupling the second resistive memory element with the second bit line;
    a first further transistor coupled to the first resistive memory element to apply a predefined potential at a first node between the first selection transistor and the first resistive memory element; and
    a second further transistor coupled to the second resistive memory element to apply a predefined potential at a second node between the second selection transistor and the second resistive memory element.

14. The memory circuit of claim 13,
    wherein the first and the second selection transistors are rendered conductive if a first potential is applied, and are rendered non-conductive if a second potential is applied; and
    wherein the first and the second further transistors are rendered conductive if the second potential is applied, and are rendered non-conductive if a third potential is applied.

15. The memory circuit of claim 14,
    wherein the first selection transistor is controlled via a first word line and the first further transistor is controlled via a second word line; and
    wherein the second selection transistor is controlled via the second word line and the second further transistor is controlled via the first word line.

16. The memory circuit of claim 15, wherein the third potential is selected such that the first and the second selection transistors are non-conductive if controlled by the third potential.

17. The memory circuit of claim 16, wherein:
    the first and the second selection transistors are of an enhancement type and the first and second further transistors of a depletion type; and
    the first potential is set in a range between the second and the third potential.

18. The memory circuit of claim 17, further comprising:
    a control circuit configured to apply the first, second and third potentials on the first and second word lines and to apply at least one of a writing and a reading potentials on the bit line.

19. The memory circuit of claim 17, further comprising:
    a control circuit configured to:
    apply the second potential on the first and second word line in an idle state of the memory circuit so that the first and second selection transistors are non-conductive and the first and second further transistors are conductive to apply the predefined potential on the first and second resistive memory elements;

for addressing the first resistive memory element, to apply the first potential on the first word line to render the first selection transistor conductive, to apply a bit line potential to the first resistive memory element, and apply the third potential on the second word line to render the first further transistor non-conductive; and for addressing the second resistive memory element, apply the first potential on the first word line to render the second selection transistor conductive, apply a bit line potential to the second resistive memory element, and apply the third potential on the first word line to render the second further transistor non-conductive.

20. The memory circuit of claim 19, wherein the control circuit applies the third potential on the second word line either at the same time or after the first potential has been applied to the first word line.

21. The memory circuit of claim 19, wherein the control circuit applies the third potential on the first word line either at the same time or after the first potential has been applied to the second word line.

22. The memory circuit of claim 13, wherein:
a first terminal of the first resistive memory element is coupled to a first terminal of the first selection transistor and a plate element is coupled to a second terminal of the first resistive memory element to apply a plate potential;

wherein a second terminal of the first selection transistor is coupled to the bit line;

wherein the first further transistor has a first terminal which is coupled with the first terminal of the first resistive memory element and a second terminal on which a predefined potential is applied;

wherein a first terminal of the second resistive memory element is coupled with a first terminal of the second selection transistor and the plate element is coupled with a second terminal of the second resistive memory element to apply the plate potential;

wherein a second terminal of the second selection transistor is coupled to the bit line; and wherein the second further transistor has a first terminal which is coupled with the first terminal of the second resistive memory element and a second terminal on which a predefined potential is applied.

23. The memory circuit of claim 22, wherein the second terminals of the first and second further transistors are connected to the plate element.

24. The memory circuit of claim 23, wherein:
a gate terminal of the first further transistor is connected to the second word line and a gate terminal of the first selection transistor is connected to the first word line; and wherein a gate terminal of the second further transistor is connected to the first word line and a gate terminal of the second selection transistor is connected to the second word line.

25. A method for operating a memory circuit, comprising:
applying a first potential on a first word line and a second word line in an idle state of the memory circuit; wherein the first word line controls a selection transistor and the second word line controls the further transistor, and wherein application of the first potential makes the selection transistor non-conductive and makes the further transistor conductive, thereby applying a predefined potential to a resistive memory element; and accessing the resistive memory element by:
applying a second potential on the first word line to make the selection transistor conductive, thereby coupling the resistive memory element to a bit line whereby a bit line potential is applied to the resistive memory element; and applying a third potential on the second word line to make the further transistor non-conductive.

26. The method of claim 25,
wherein the selection transistor is of an enhancement type and the further transistor of a depletion type; and wherein the first potential is set in a range between the second and the third potential.

* * * * *